(12) United States Patent
Devanathan et al.

(10) Patent No.: US 7,949,920 B2
(45) Date of Patent: May 24, 2011

(54) DFT TECHNIQUES TO REDUCE TEST TIME AND POWER FOR SOCS

(75) Inventors: Varadarajan R. Devanathan, Tamilnadu (IN); Chennagiri P. Ravikumar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 1180 days.

(21) Appl. No.: 11/617,764

(22) Filed: Dec. 29, 2006

(65) Prior Publication Data

US 2007/0260952 A1   Nov. 8, 2007

Related U.S. Application Data

(60) Provisional application No. 60/745,117, filed on Apr. 19, 2006.

(51) Int. Cl.
*G01R 31/28* (2006.01)
(52) U.S. Cl. .......... 714/729; 714/30; 714/724; 714/726; 714/727
(58) Field of Classification Search .................... None
See application file for complete search history.

(56) References Cited

U.S. PATENT DOCUMENTS

| | | | |
|---|---|---|---|
| 6,115,763 A * | 9/2000 | Douskey et al. | 710/72 |
| 6,587,981 B1 * | 7/2003 | Muradali et al. | 714/726 |
| 6,996,758 B1 * | 2/2006 | Herron et al. | 714/726 |
| 7,080,283 B1 * | 7/2006 | Songer et al. | 714/30 |
| 7,284,175 B2 * | 10/2007 | Wang et al. | 714/727 |
| 7,539,915 B1 * | 5/2009 | Solt | 714/726 |
| 2009/0164860 A1 * | 6/2009 | Ishimura et al. | 714/731 |

* cited by examiner

*Primary Examiner* — John P Trimmings
(74) *Attorney, Agent, or Firm* — Dawn V. Stephens; Wade James Brady, III; Frederick J. Telecky, Jr.

(57) ABSTRACT

A technique for reducing the overhead of daisy chain test mode in divide-and-conquer testing using intermediate test modes that do not span all cores or all flip-flops in the core. The partial residual test mode spans across a subset of the cores and allows to bound the number of cores that a full residual test mode may span across. The interaction of the cores among one another at the top-level is analyzed and the minimum number of flip-flops in a core that must participate in a intermediate test mode is selected. Algorithms are devised to analyze the interactions among the cores and build data structures which are used for identifying intermediate test modes. Using a reconfigurable scan segment architecture, intermediate test modes are implemented that are designed to work with all known test compression solutions. Since the length of the longest scan chain in an intermediate residual test mode is much smaller than the length of the longest scan chain in the full residual test mode, there is a substantial improvement in test application time as well as test peak power.

25 Claims, 5 Drawing Sheets

DFT TECHNIQUES TO REDUCE TEST TIME AND POWER FOR SOCS

PRIORITY FROM RELATED APPLICATIONS

This application claims priority under 35 USC §119 (e) (1) of provisional application No. 60/745,117, filed on Apr. 19, 2006.

TECHNICAL FIELD OF THE INVENTION

The present invention relates generally to digital integrated circuits, and more particularly relates to Design-for-Test (DFT) techniques for Systems-on-Chips (SoCs).

BACKGROUND OF THE INVENTION

Sequential scan techniques are often used to test integrated circuits. According to a typical sequential scan technique, integrated circuits are designed to operate in functional mode or test mode. In functional mode, elements in the integrated circuit are connected according to a desired design and to provide a desired utility for which the integrated circuit is primarily designed. In test mode, the integrated circuit is generally designed to connect various memory elements (contained in the integrated circuit) such as flip-flops in a sequence referred to as a "scan chain" (i.e., the output of one element is connected as an input to the next element). The first element in the scan chain is generally designed to receive the input bits and the last element of the scan chain is designed to scan out the results of evaluation, as described below.

In a typical scan test scenario, a number of bits in a particular pattern of zeros and ones (scan vector) are sequentially (one bit at every clock cycle) loaded (scanned in) into scan chain through the first element. The number of bits contained in the scan vector generally equals the number of memory elements in a corresponding scan chain. Once a scan chain is loaded with a scan vector, the elements (generally the combinatorial logic) in the integrated circuit are evaluated based on the scanned in bits. The flip-flops are designed to latch the results of the evaluation, and the bits latched in the scan chain are sequentially scanned out (one bit at every clock cycle) through the last element in the scan chain. The received scan out is compared with an expected scan out corresponding to the scan vector to determine the various faults within the integrated circuit. Multiple scan chains are present, particularly in very large scale integrated circuits. Each scan chain covers a corresponding portion of the integrated circuit, and thus may need to be tested with a corresponding set of scan vectors. Accordingly, when a scan chain is loaded and tested with a scan vector, a desired controllability (of the internal logic of the portion being tested) and observability (visibility of the corresponding accuracy of operation) of the corresponding portion is obtained.

In general, such tests need to be performed meeting at least some of several requirements. Some of such requirements include minimizing the testing time, reducing power dissipation during test time, etc. Reducing the test time generally leads to corresponding lower costs since the usage of testing equipment (and labor type overhead) is reduced. Reduction of power dissipation is of concern since substantially more power dissipation may occur in test mode compared to functional mode, and integrated circuits may be designed with a power dissipation specification corresponding to only the functional mode.

In a SoC with multiple cores, an ideal way to practice hierarchical scan testing is to permit one test mode for each individual core where the other cores are not tested. However, due to the presence of top-level logic (glue logic) and interaction among the cores, some top-level testing is unavoidable. In the traditional divide-and-conquer scan test, the top-level testing takes the form of the so-called "daisy chain" mode or "residual scan" mode in which internal scan chains in the cores are reconfigured into top-level scan chains and the entire scan flip-flops in the design participate in testing. The residual scan mode is expensive in terms of test application time and test power and wipes out the benefits achieved by hierarchical scan. This is also the case for hierarchical scan test compression; while core internal test patterns may be compressed and lead to reduction in test application time, no compression may be possible for the full residual test mode. As a result, the overall test time reduction and scan pattern volume reduction may be small, even though dramatic improvements in test time and scan data volume are possible in individual core internal test modes. Hence, the problem of bringing down the negative impact of the full residual test mode is addressed. The problem is more challenging when the cores are unwrapped i.e., do not have bounding chains. Most of the existing work on test time reduction assumes that the cores have test wrappers. Reducing the scan test time and scan test power for unwrapped cores such as Application Specific Integrated Circuits (ASICs) remains a large problem.

SUMMARY OF THE INVENTION

According to an aspect of the subject matter, a system and method is provided for the use of intermediate (partial) residual test modes that do not span all cores or all flip-flops in the core. The system includes a top-level (glue) logic, a plurality of cores in communicating relationship with each other via the glue logic, a set of flip-flops that includes scan flip-flops. The scan flip-flops is a subset of the set of flip-flops that are connected within a core scan chain, and a scan router logic is coupled to the set of flip-flops. The scan router logic groups the set of flip-flops into test groups and test modes based on recursive grouping of interactions among the plurality of cores, wherein the test modes include core internal test modes, full residual test modes and partial residual test modes. The scan router logic determines and reconfigures core scan segments to form a reduced core scan segment model based on connectivity and interaction within and among the plurality of cores. The reconfigurable scan segment architecture implements partial residual test modes that works with all known on-chip test compression solutions.

BRIEF DESCRIPTION OF THE DRAWINGS

The present subject matter will be described with reference to the following accompanying drawings, which are described briefly below.

DETAILED DESCRIPTION OF THE INVENTION

In the following detailed description of the embodiments of the present subject matter, reference is made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present present subject matter. The following detailed description is, therefore, not to be taken in a limiting sense, and the scope of the present present subject matter is defined only by the appended claims.

As SoCs are becoming increasingly complex, hierarchical solutions such as DFT are suited for integration of the cores. In hierarchical scan design architecture such as divide-and-conquer scan, testing is done in two phases. In the first phase, known as core internal test mode, test patterns are generated for each core independently, targeting the faults within each core. In the second phase, called the full residual test mode or daisy chain test mode, test patterns are generated for the remaining faults that are not detected by the individual core internal test modes. The full residual test mode detects faults in the glue logic between the cores at the top-level. The cores used in a SoC may be wrapped or unwrapped.

Figure 1:
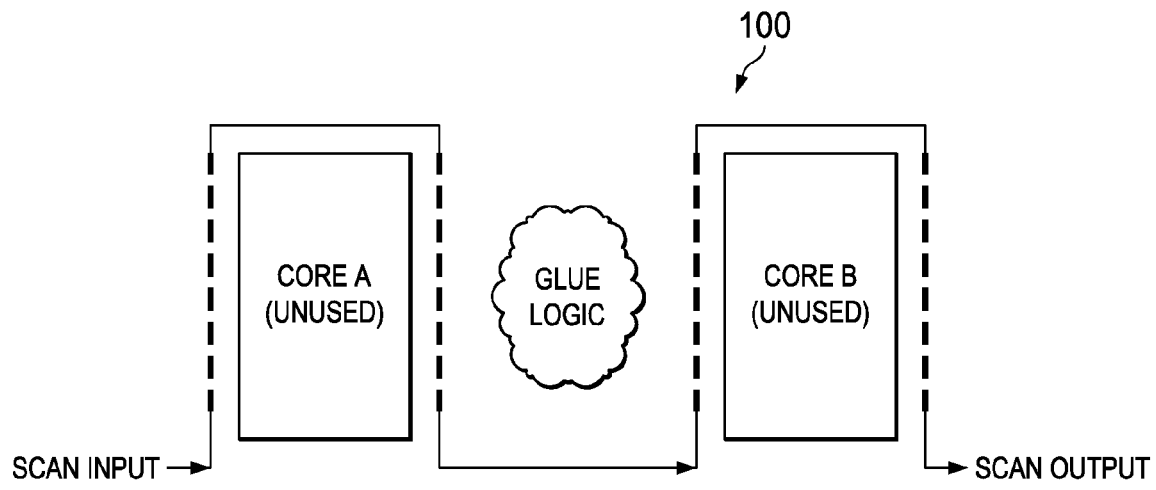
FIG. 1 is an example illustration of a full residual test mode on a SoC with wrapped cores.

Referring now to FIG. 1, there is illustrated an example full residual test mode on a SoC with a wrapped core 100. As shown, in the SoC with wrapped core 100 the input and output ports denoted by Core A and Core B of the core are registered and the registers at the boundary are stitched into a bounding scan chain. As a result, the periphery of the core is fully controllable and observable. When all the cores of a SoC are wrapped, to test the glue logic, the full residual test mode involves scanning the test data only into the scan input and out of the scan output of the bounding scan chains and not into the internal scan chains of the cores.

Figure 2:
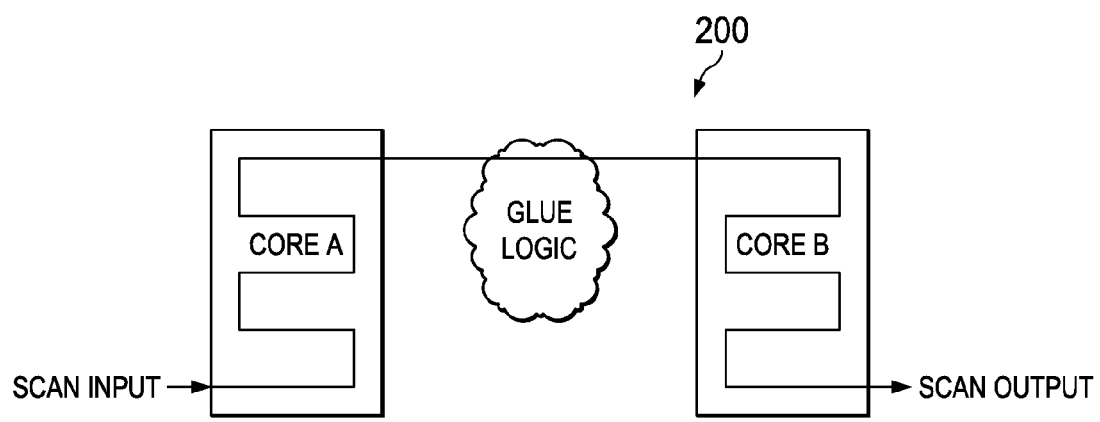
FIG. 2 is an example illustration of a full residual test mode on a SoC with unwrapped cores.

Referring now to FIG. 2, there is illustrated an example full residual test mode on a SoC with unwrapped core 200. The input and output ports of an unwrapped core are not registered, and therefore are not fully observable or controllable. Hence, the full residual test mode with unwrapped cores uses the scan flip-flops internal to the cores for testing the glue logic, as shown in FIG. 2. As shown in FIG. 2, the scan chain has a scan input, and a scan output.

Generally, unwrapped cores are common in real designs due to the extra area and or performance overhead associated with bounding registers in wrapped cores. Although test compression is commonly used as a technique for reducing the test application time for the cores, full residual test mode still remains a bottle-neck. While the number of test cycles in the individual test modes may be reduced significantly through test compression, there is little compression possible for the residual scan mode patterns, thereby reducing the effective speedup possible through compression. Hence, solutions are sought to reduce the impact of the full residual test mode.

Most of the existing work on test time reduction for SoCs assumes that the cores are wrapped. For large cores, the number of wrapper cells is large, and the associated area and performance overhead is a deterrent for using the same. Some DFT insertion tools attempt to reuse the internal scan cells of the core as wrapper cells, and this reuse factor is negligibly small. Reducing test times with SoCs with unwrapped cores is a big challenge, and various methods were used to overcome this problem. On-chip compression techniques were implemented at each core to reduce the test time of cores. By selecting a subset of flip-flops and adding test points to the design enhances the controllability and observability of the glue logic. The length of the scan chain of the residual test mode is reduced thereby reducing the test time. Another technique was to test unwrapped cores concurrently along with wrapped cores. Light wrappers were added to unwrapped cores to enhance controllability and observability. Other techniques used minimum number of wrapper cells to reduce timing and area impact. All of the above approaches use additional logic in the functional path.

The present subject matter discusses a technique for reducing test time and power of SoCs with unwrapped cores without impacting functional timing of the design. In this technique, the hierarchical DFT methodology is further extended by forming test groups which are formed by recursively grouping the cores based on their interactions with each other. Basically, each core is a group by itself and the full residual test mode is also a test group and includes all the cores. In addition, partial residual test modes are allowed. For example, if $A1, A2, , , A4$ are cores in a SoC, the conventional divide-and-conquer DFT scan permits 5 modes, namely $\{A1\}, \{A2\}, \{A3\}, \{A4\}$ for each of the cores, and a full residual test mode for $\{A1,A2,A3,A4\}$ to detect faults in the glue logic that connects the cores at the top-level. Solutions of the form $\{A1\}, \{A2\}, \{A3\}, \{A4\}, \{A1, A2\}, \{A3, A4\}, \{A1, A2, A3, A4\}$ are permitted, with the last three modes being examples of partial residual test modes. The partial residual test mode $\{A1, A2\}$ will cover faults in the glue logic between A1 and A2. After the modes $\{A1, A2\}$ and $\{A3, A4\}$ are completed much fewer number of faults will be expected to be covered in the $\{A1, A2, A3, A4\}$. As an example, if the glue logic only exists between A1 and A2, and between A3 and A4, the final full residual test mode $\{A1,A2,A3,A4\}$ may be entirely eliminated. The amount of interaction between the cores must be carefully analyzed to prescribe the test modes. A cursory calculation of the number of test modes is to calculate the number of subsets of the set of all cores which is 2 to the power of n, where n is the number of cores. The actual number of test modes would be much larger since the order in which the cores appear within a test mode will also be important. The inventive technique describes an algorithm for automatic identification of test groups based on the interactions among the cores. A reduced core scan segment model of the core is then proposed that includes only the necessary flip-flops required for each test group. The proposed algorithm provides automated extraction of the required flip-flops to various core scan segments. Since the number of test modes is exponentially large, constraints are introduced in the algorithm to limit the number of test groups and core scan segments. The present subject matter also provides seamless integration of the reconfigurable core scan segments with on-chip test compression solutions to significantly minimize the test time of core internal test modes.

Figure 3:
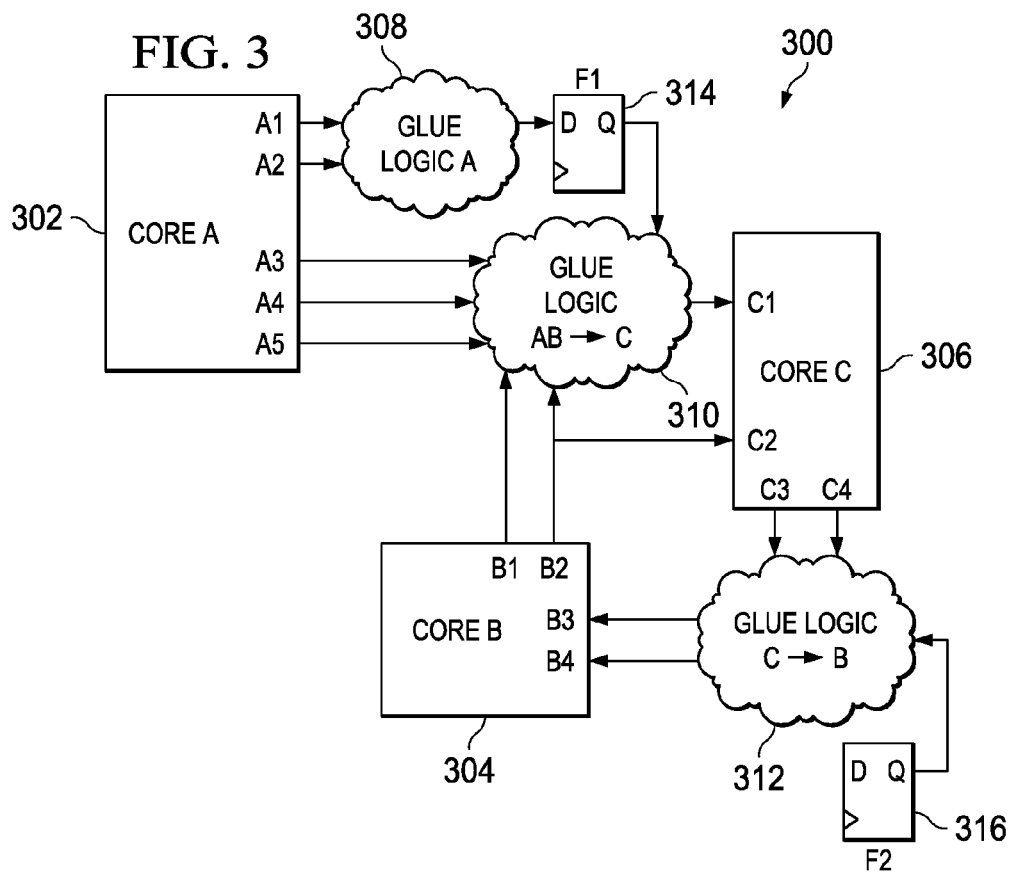
FIG. 3 illustrates quantifying the interaction among cores according to an embodiment of the present present subject matter.

Referring now to FIG. 3, an exemplary strategy for quantifying the interaction among cores is described. As described earlier, in a full residual test mode, faults are detected in the glue logic that connects the cores at the top-level. The present subject matter provides a strategy for identifying the test groups along with an algorithm. Since each pair of cores may interact differently, the number of test patterns needed to detect faults in the glue logic of each such interaction varies. If highly interacting cores are tested before the full residual test mode is run, then the full residual test mode takes fewer patterns. The technique to identify such highly interacting cores is presented in this section. As shown in FIG. 3, the block diagram 300 illustrates the interaction among 3 hypothetical cores A, B and C denoted by 302, 304, and 306, respectively. F1 and F2 are flip-flops that are not present within the core and are in the top-level. Glue Logic A referenced to as 308 is the combinational logic at the top-level that receives inputs from Core A 302, the output of which feeds into the data of a flip-flop F1 314. Glue Logic AB→C denoted by 310 refers to combinational logic at the top-level that receives inputs from core A 302 and core B 304 and generates outputs for feeding into Core C 306. Glue Logic C→B denoted by 312 refers to combinational logic that receives inputs from core C 306, whose outputs feed into Core B 304. The faults in Glue Logic A 308 are tested in a residual scan test that scans in the appropriate bits into the scan flip-flops in core A 302 and captures the response in scan flop F1.

If flip-flops at the top-level that control or observe core A 302 are also included in testing of core A, then Glue Logic A 308 is tested during test for core A 302 itself. If top-level flip-flops such as F1 314 and F2 316 are absorbed into core internal test modes, then only the full residual test mode will catch the faults associated with Glue Logic AB→C 310 and Glue C→B 312 which represent purely combinational interaction among the cores. If top-level flip-flops are not included during testing of individual cores, then even sequential interaction among the cores is tested during the full residual test mode. This will further increases the pattern count of the full residual test mode and thereby the test time. The present subject matter presupposes that top-level flip-flops that control or observe the cores are included in testing the individual cores. The interaction level for a glue logic is quantified by the number of inputs that feed it. For example, the glue logic AB→C 310 has five inputs, three of which are coming from Core A 302 (A3, A4, and A5) and the remaining two coming from Core B 304 (B1 and B2). Similarly the Glue logic C→B 312 has 2 inputs C3 and C4 feeding it.

The present subject matter further provides an Algorithm 1 (GetCoreInteraction) for identifying the interaction among cores. For every input port of each core, the fanin cone of logic observable at the input port is examined. The cone terminates either at a top-level primary input, a core output port or a top-level flip-flop. Sequential interactions are ignored as the top-level flip-flops a re included in the individual core internal test modes. Further, since there is full controllability from top-level primary input port, only output ports of other cores that feed the fanin cone are considered for interactions. The GetCoreInteraction Algorithm is illustrated with the example of FIG. 3. Assuming that the Cores A, B and C are numbered 1, 2 and 3 respectively, for Core C, lines 4 to 14 of Algorithm 1 are executed for the input ports C1 and C2. The fanin cone for port C1 includes the pins A3, A4, A5, B1, and B2. F1 is ignored since it is a top-level flip-flop. At Line 8 of the Algorithm ControllingCores [C] [C1] is set to $011_2$ denoting that Cores A and B are controlling cores with respect to Core C. At line 10 for ports A3, A4 and A5, ObservingCores [A] [A3]=Observing Cores [A] [A4]=ObservingCores [A] [A5] is set to $100_2$ denoting that these pins are observed in Core C. Similarly at line 10, for ports B1 and B2 ObservingCores [2] [1]=ObservingCores [2][2]=$100_2$. At line 14 CoreInteraaction [C] [A, B] is derived as 5 (i.e. Interaction AB to C=5.

For port C2, the fanin cone consists of only B2. At line 8, ControllingCores [C][C2]=010-2 {Set {B}); at lines 10 for B2 ObservingCores [B][B2]=$011_2$ {Set B}, at lines 10 for B2, observing cores {B} {B2}=$100_2$ {Set C}. At line 14, CoreInteraction {C} {B} is identified as 1 (i.e. interaction B to C=1).

---

Algorithm GetCoreInteraction

Algorithm: GetCoreInteraction
Input - Design netlist with n cores and the core netlists
Output -
    CoreInteraction[a][B] : The number of output ports from the set of cores B,
    observable at core a. Set B is represented as a bit-vector <$B_n B_{n-1}...B_1$> where $B_j$ is
    set to 1 if and only if the set B includes core j
    ControllingCores[a][p] : The set of cores that control the input pin p of core a
    ObservingCores[a][p] : The set of cores that observe the output pin p of core a 1. BEGIN
2.   for each core d do
3.     for each input port i of core d do
4.       Trace the fanin cone $C_i$ of port i terminating at either a top-level primary input or a top-level flop or an output pin of a core;
5.       for each input port j of cone $C_i$ do
6.         if (j is an output port of core s) AND (s != d) then
7.           //Remember that core s controls the pin i of core d
8.           ControllingCores[d][i] | = (1 << s) ;
9.           //Remember that core d observes the pin j of core s
10.          ObservingCores[s][j] | = (1 << d) ;
11.         end if
12.       end for
13.       //Update the interactions observable at core d
14.       CoreInteraction[d][ControllingCores[d][i]] += number of output ports of other cores in $C_i$ ;
15.     end for
16.   end for
17. END Based on the interaction among the cores provided by Algorithm GetCoreInteraction, a greedy heuristic called GetTestGroups has been proposed to extract the various test groups. During this extraction step (FIG. 8), the minimal set of flip-flops are extracted for the test groups and test modes to identity the core peripheral flops and the core internal flops. The heuristic takes as inputs the maximum number of test groups that it must generate (MAX_TG) and the maximum number of test groups that a core may participate in (MAX_TG_CORE). In the proposed scan test architecture only those scan flip-flops in a core C that are necessary to test its interaction with other cores are used in a test group. MAX_TG_CORE limits the number of possible scan segments that need to be stitched within a core. Since the number of possible test groups is exponential in the number of cores, MAX_TG constraint limits the number of test groups used.

Algorithm GetTestGroups

```
Algorithm: GetTestGroups
Input -
    CoreInteraction[a][B] : output of Algorithm 3
    MAX_TG_CORE : Maximum number of test groups per core
    MAX_TG : Maximum number of test groups for the entire design
Output - TG: List of test groups satisfying the constraints
MAX_TG_CORE and MAX_TG
 1.    BEGIN
 2.    for each core d do
 3.        used[d] = 0 ;
 4.    end for
 5.    i = 1 ;
 6.    while i <= MAX_TG do
 7.        <d,j> = Maximum entry in CoreInteraction ;
           // CoreInteraction[d][j] >= CoreInteraction [s][i], for all s,i
 8.        if CoreInteraction[d][j] == 0 then
 9.            break ; //No more test groups possible
10.        end if
11.        CoreInteraction[d][j] = 0 ; //Do not use this test group again
12.        if used[d] <MAX_TG_CORE then
13.            flag = true ;
14.            for all cores s in bit-vector j do
15.                if used[s] >= MAX_TG_CORE then
16.                    flag = false ;
17.                    break ; // core s reached the limit - discard j
18.                end if
19.            end for
20.            if flag == true then
21.                TG[i] = <j,d> ; //Set of cores in bit-vector j,
observable at d
22.                i ++ ;
23.                used[d] ++ ;
24.                for all cores s in bit-vector j do
25.                    used[s] ++ ;
26.                end for
27.            end if
28.        end if
29.    end while
30.    END
```

Figure 4:
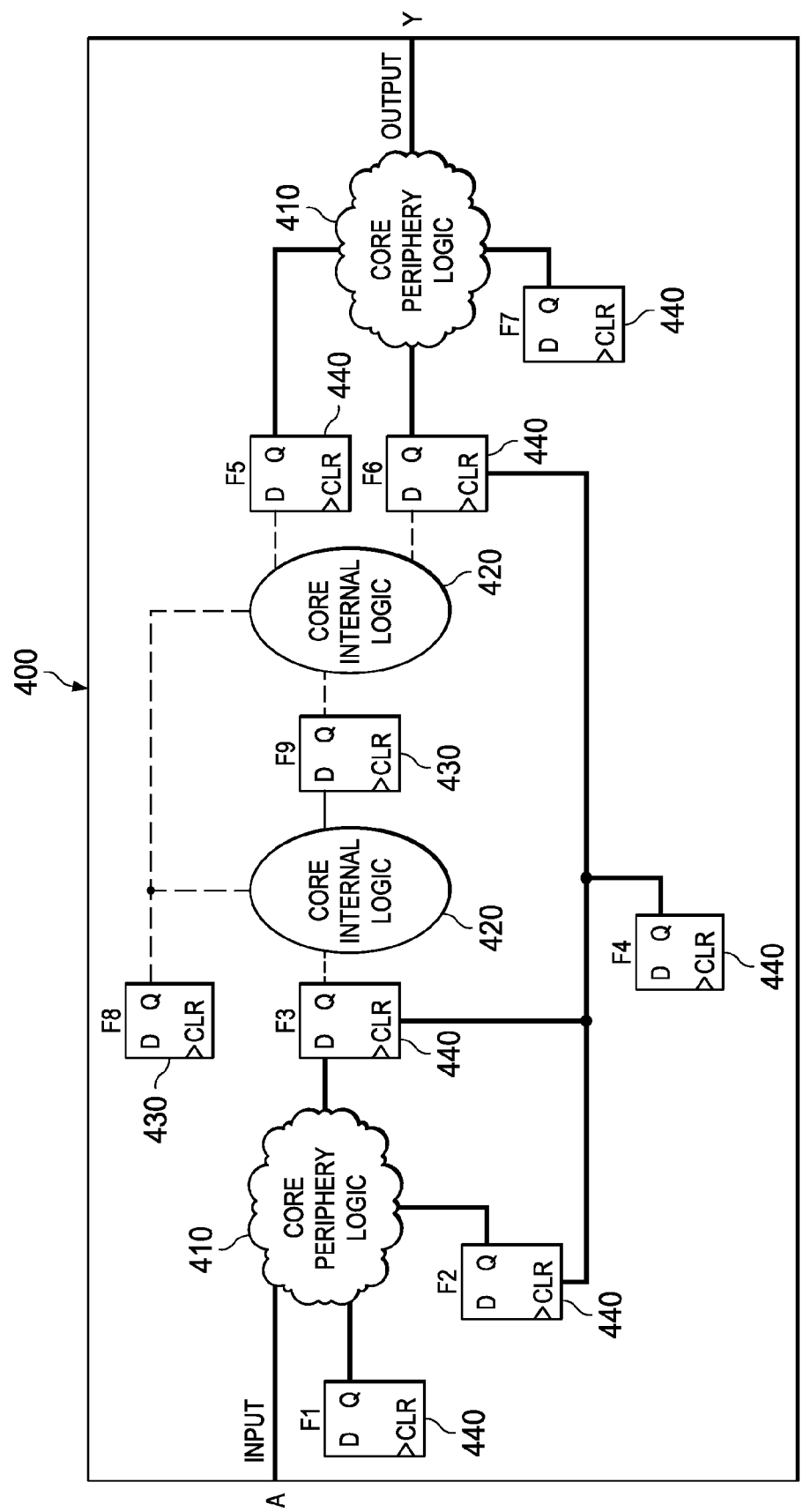
FIG. 4 illustrates the role of core internal flip-flops in full residual test mode according to am embodiment of the present subject matter.

Referring now to FIG. 4, the block diagram illustrates an example segmentation of core-scan flip-flops for testing each interaction using a sample core 400. The reconfigurable scan segment architecture for the cores is described here as well. The inputs and outputs of the core are A and Y, respectively. F1 to F9 denote the flip-flops in the sample core 400. F8 and F9 are flip-flops within the core that do not directly interact with the core periphery (i.e., inputs and outputs of the core) and are designated as core internal flip-flops 430. Core peripheral flip-flops within the core that interact with or observe and control the periphery are identified using the following 3 step process.

Inside the core, the logic that interfaces or interacts with the periphery (inputs/outputs) of the core is the interface (periphery) logic designated as Core Periphery Logic 410 and the logic that interacts with the core internal flip-flops is the Core Internal Logic illustrated as 420. In the example core 400, the Core Periphery Logic 410 is the logic between input A of the core 400 and flip-flop F3, and the logic between the flip-flops F5, F6, F7 and output Y. Therefore, the first step identifies the core peripheral flip-flops in core 400 as F3, F5, F6, and F7.

The paths exercised during core internal test are indicated by the dashed lines. Bold lines indicate the paths exercised that are necessary for testing the top-level or glue logic. F1 and F2 are flip-flops that interact with the Core Periphery Logic 410. In the example core 400, F4 is a flip-flop that controls the asynchronous clear/preset signals (e.g., CLR) of all the flip-flops that interact with the Core Periphery Logic 410. As the core input A is captured at flip-flop F3, it is necessary for flip-flop F3 to observe A. At the same time, to propagate values from input A to core internal flip-flop F3, flip-flops F1 and F2 (which control the combination logic) are also necessary. To capture the values into core internal flip-flop F3, the clear input of the flip-flop CLR should be inactive. So core internal flip-flop F4 which controls the clear input of F3 is also necessary for observing. The second step identifies the flip-flops necessary to observe the core input A, for which the core internal flip-flops F1, F2, F3 and F4 are necessary. The third step identifies the flip-flops necessary to control the core output Y. For this, flip-flops F4, F5, F6, and F7 are necessary. The core internal flip-flops F8 and F9 are required only for testing within the core and are not required for testing the top-level glue logic. Hence for the full residual test mode, only the core internal flip-flops F1 to F7 are necessary.

There are four different classifications of flip-flops based on its interaction with the core interface logic. The flip-flops in the fanout of the core inputs are Class 0 flip-flops. These flip-flops observe the core inputs, for example, flip-flop F3 of FIG. 4. The flip-flops in the fanin of the core outputs are Class 1 flip-flops. These flip-flops control the core outputs, for example, flip-flops F5, F6, and F7 of FIG. 4. The flip-flops in the fanin of data inputs of class 0 flip-flops are Class 2 flip-flops. These flip-flops aid in propagating the logic from the core inputs to the class 0 flip-flops, for example, flip-flops F1 and F2 of FIG. 4. The flip-flops that control the asynchronous control inputs (such as clear, preset inputs) of class 0, class 1 and class 2 flip-flops are Class 3 flip-flops. They enable the class 0, 1, and 2 flip-flops to successfully capture and propagate the logic, for example, flip-flop F4 of FIG. 4. Thus, the flip-flops that interact with the periphery are used for testing the glue logic. All the remaining flip-flops that are not reachable from any of the core ports are grouped under internal core scan segment that is used only during the core internal test mode and is not included for testing the glue logic.

The interactions among the cores may further be refined for optimally testing the test group interactions. For example, in FIG. 3, to test the AB→C interaction, the only subsets used are the Class 1 and Class 3 flip-flops for outputs A3, A4 and A5. Class 1 and Class 3 flip-flops are used for outputs B1 and B3 of core B, whereas Class 0, Class 2, Class 3 subset of flip-flops are used for input C3 of core C.

Figure 5:
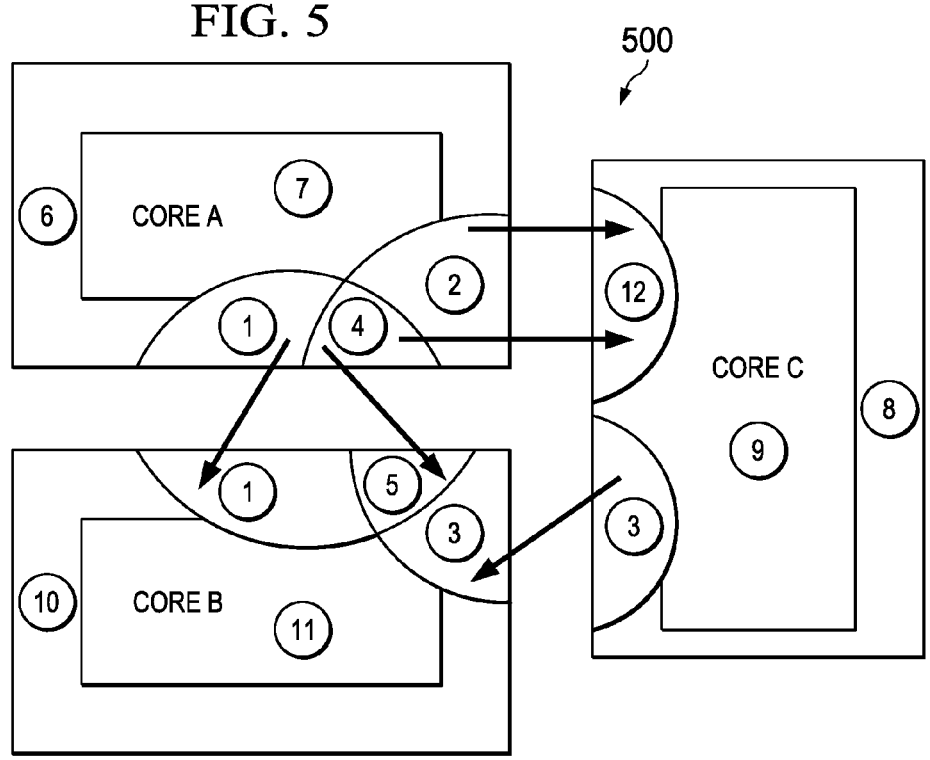
FIG. 5 illustrates the interaction of flip-flops among cores according to an embodiment of the present subject matter.

Referring now to FIG. 5, there is illustrated the need for scan segments that span across multiple cores and depicts the interaction of the flip-flops among cores. Flip-flops of core A marked 4 in FIG. 5 participate in both interactions A→B and A→C. These flip-flops should be in the scan chain for the A→B test group and the A→C test group. Thus, core A must include the following five scan segments:

The first scan segment includes scan segments for flip-flops in both A→B and A→C test group. This scan segment is indicated by 4 in FIG. 5 is used in core internal test mode, full residual test mode, the A→B test mode and the A→C test mode. The second scan segment includes scan segments for flip-flops that are in A→B and not in A→C test group. This segment indicated by 1 in FIG. 5 is used in core internal test mode, full residual test mode and A→B test mode. The third scan segment includes scan segments for flip-flops that are not in A→B test group but are in A→C test group. This scan segment, indicated as 12 in FIG. 5 is used in core internal test mode, full residual test mode, and A→C test group. The fourth segment includes scan segment for flip-flops that neither interacts with B nor with C. This segment indicated as 6 in FIG. 5 is used in core internal test or full residual test mode. The fifth or last scan segment includes the scan segment for internal flip-flops of core A. This scan segment indicated as 7 in FIG. 5 is only used in core internal test mode. Similarly shown are internal flip-flops of core B and core C indicated by 11 and 9, respectively. As shown in FIG. 5, the internal flip-flops that interact with other top-level (glue) logic for Core A, Core B and Core C are indicated by 6, 10 and 8, respectively.

Figure 6:
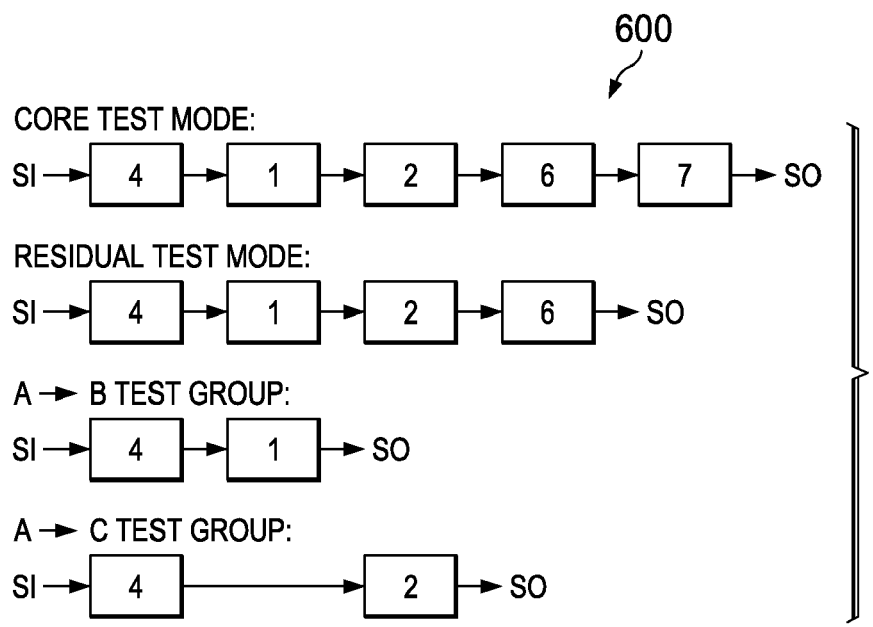
FIG. 6 illustrates the core scan segments of Core A of FIG. 5.

Referring now to FIG. 6, an exemplary hook up of the scan segments of Core A for various test modes is illustrated. The scan inputs and scan outputs of the test modes are denoted by SI and SO respectively. Multiplexer based scan router logic is used for connecting the various segments as shown in FIG. 6. As the scan chain length reduces from the core internal test mode to the full residual test mode, and reduces further for the partial residual test modes, reductions in total test time and power are obtained. Since the number of cycles spent on loading the scan chain reduces, the test time also reduces. Since only a limited subset of flip-flops is used in the partial residual test modes, test power is reduced by constraining the remaining flip-flops not to toggle. In the output of the Get-CoreInteraction Algorithm, the output observing cores [a][p] denotes the list represented as a bit vector of cores that interact with the ports p of core. This bit vector representation directly maps to a minterm representation explained below. Suppose that core A interacts with g other cores (viz., 1, 2 . . . g) and Ai denotes the set of flip-flops in core A which interact with core i. Every core scan segment may be expressed as a minterm. For example, if g=2, $A1 \cap_1 A2$ denotes the core scan segment of core A that interacts only with group 1, but not with group 2. This corresponds to set 1 of FIG. 5. Similarly, $_1A1 \cap_1 A2$ represents set 6 of FIG. 5. Apart from all the minterms, the internal flip-flops also contribute to a scan segment which is included only during testing of the core. Hence, the total number of core scan segments is $2^g+1$ (for $2^g$ minterms+1 segment for internal flip-flops). Thus the core scan segments may be automatically derived from the bitmap corresponding to ObserveCores [a][p]. This also explains the exponential number of core scan segments with number of test groups. To avoid this unacceptable complexity a heuristic technique is used where the maximum number of participating cores is in a partial residual test mode is bounded.

Figure 7:
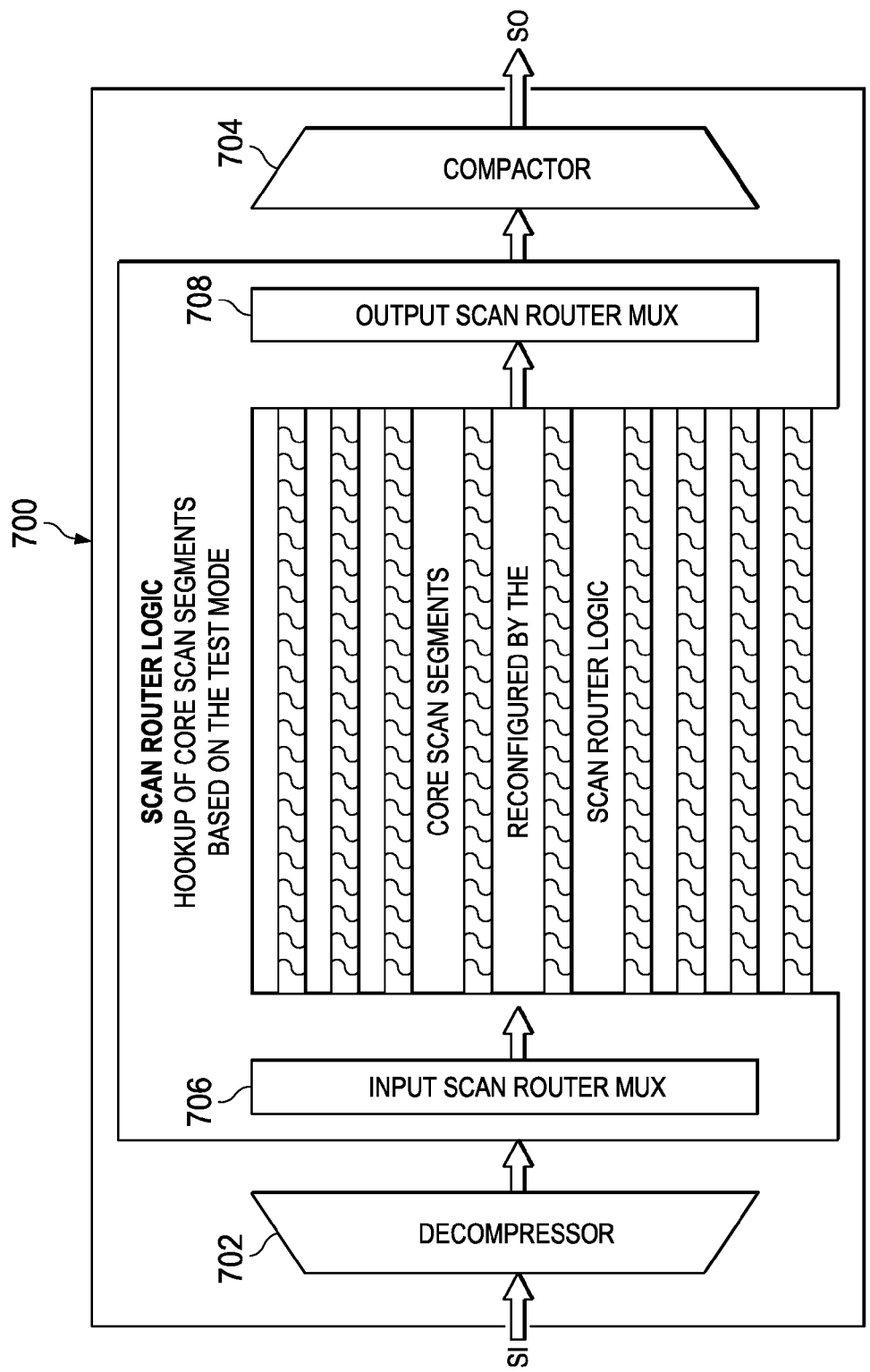
FIG. 7 illustrates the integration of on-chip test compression according to am embodiment of the present subject matter.

Referring now to FIG. 7, there is illustrated an example system level integration of on-chip test compression. Scan test compression techniques have become increasingly popular in testing chips. An on-chip test compression solution has a decompressor 702 (such as a linear feedback shift register (LFSR), or a ring generator), that feeds the scan input SI, and a compactor 704 (such as a multiple input signature register (MISR), or XOR tree, or AND tree) that observes the scan output SO. For the proposed technique to be amenable to such an environment, the interface between the decompressor 702 and the compactor 704 to the core scan inputs and outputs must be invariant, irrespective of the selected test mode. This can be achieved by ensuring that the decompressor and the compactor connect to the scan router logic instead of the core scan segments. The decompressor 702 and the compactor 704 logic are connected to the scan router multiplexers instead of the conventional core scan chains. As a result, irrespective of the test mode selected, and the configuration of the core scan chains, the decompressor and compactor connections remain fixed and connected to the desired scan segments, thereby achieving seamless integration of on-chip test compression.

Figure 8:
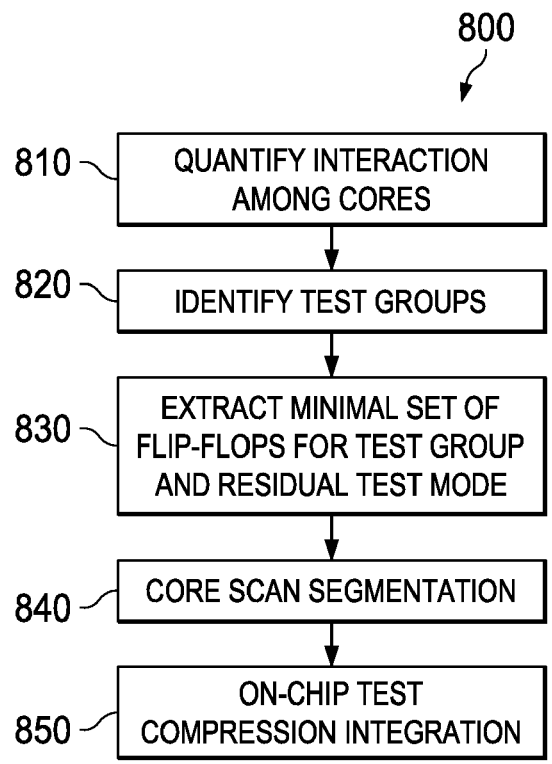
FIG. 8 is a flowchart illustrating a method for reducing test time and power for SoCs according to an embodiment of the present subject matter.

Referring now to FIG. 8, there is illustrated an example method 800 for reducing test time and power for SoCs. At step 810, this example method 800 begins by quantifying the interaction among cores using the GetCoreInteraction algorithm described in the preceding sections. At step 820, test groups are identified from the set of flip-flops used within the cores by using another algorithm GetTestGroups. Following step 820, the minimal set of flip-flops is extracted for forming the test groups and the test modes. At step 840, core scan segments are formed by the scan router logic and the final step 850 integrates on-chip test compression solutions as described in the previous sections. The method of reducing test time and power for SoCs is explained in more detail with reference to FIGS. 1-8.

Although the flowchart 800 includes steps 810-850 that are arranged serially in the exemplary embodiments, other embodiments of the subject matter may execute two or more steps in parallel, using multiple processors or a single processor organized as two or more virtual machines or sub-processors. Moreover, still other embodiments may implement the steps as two or more specific interconnected hardware modules with related control and data signals communicated between and through the modules, or as portions of an application-specific integrated circuit. Thus, the exemplary process flow diagram is applicable to software, firmware, and/or hardware implementations.

The above-described technique and algorithms provide a solution for reducing test application time and power for testing SoCs with unwrapped cores. It extends the hierarchical scan test architecture by defining partial residual test modes based on pure combinational interactions among test modes to test the interaction among cores. Faults in the glue-logic along the sequential interaction is detected during the individual core internal test itself, if corresponding top-level scan flip-flops are included in the core internal test mode. Further, the present subject matter illustrates the segmentation of core-scan flip-flops for testing each interaction. Core scan segments consisting of only those scan flip-flops that are required for testing each partial residual test mode interaction provide a reduced core scan segment model. A reconfigurable scan segment architecture is presented that supports partial residual test modes that may be used with known on-chip test compression solutions. It is expected that the above-described methods and apparatus may be implemented for any type of memory designs using DFT. Although, the technique described above gives the maximum improvement for unwrapped cores, it may still be used with wrapped cores to obtain benefit. For example, in a system with four cores out of which only three cores may have scan chains, the technique can still be practiced. In this example, only the cores that have scan chains are included in the analysis for the reduced core scan segment, and the cores that do not have scan chains are treated as top-level glue logic.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present subject matter may be implemented in a number of different embodiments, including various methods, an apparatus, and a system. Other embodiments will be readily apparent to those of ordinary skill in the art. The elements, algorithms, and sequence of operations may all be varied to suit particular requirements.

FIGS. 1-8 are merely representational and are not drawn to scale. Certain proportions thereof may be exaggerated, while others may be minimized. FIGS. 1-8 illustrate various embodiments of the present subject matter that may be understood and appropriately carried out by those of ordinary skill in the art.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the present subject matter, various features are grouped together in a single embodiment for the purpose of streamlining the disclosure. This method of disclosure is not to be interpreted as reflecting an intention that the claimed embodiments of the present subject matter require more features than are expressly recited in each claim. Rather, as the following claims reflect, inventive subject matter lies in less than all features of a single disclosed embodiment. Thus the following claims are hereby incorporated into the detailed description of the embodiments of the present subject matter, with each claim standing on its own as a separate preferred embodiment.

The invention claimed is:

1. A System-on-Chip (SOC) comprising:
a top-level (glue) logic;
a plurality of cores in communicating relationship with each other via the glue logic;
a set of memory elements (flip-flops) in each core, wherein the set of flip-flops includes scan flip-flops in one or more of the plurality of cores, wherein the scan flip-flops is a subset of the set of flip-flops that are connected within a core scan chain; and
a scan router logic coupled to the set of flip-flops that determines core scan segments from the core scan chain, wherein each core scan segment substantially include the scan flip-flops that require testing each intermediate (partial) residual test mode interaction in the SoC, and wherein the scan router logic reconfigures the determined core scan segments to form a reconfigured (reduced) core scan segment model based on connectivity and interaction within and among the plurality of cores.

2. The SoC as in claim 1, wherein the scan router logic groups the set of flip-flops into test modes based on recursive grouping of interactions among the plurality of cores, wherein the test modes include core internal test modes, full residual rest modes and partial residual test modes, wherein the scan router logic groups the set of flip-flops into test groups based on connectivity and interaction within and among the plurality of cores to form core scan segments, wherein the test groups include top-level flip-flops, core internal flip-flops, and core peripheral flip-flops, and wherein the core scan chain has a scan input, SI and a scan output SO.

3. The SoC as in claim 2, further comprising:
a decompressor to feed the scan input of the core scan chain; and
a compactor to observe the scan output of the core scan chain, wherein the decompressor and the compactor are connected to the scan router logic for seamless integration of on-chip test compression.

4. The SoC as in claim 2, wherein the core scan segments are based on the test groups and the test modes.

5. The SoC as in claim 2, wherein the set of flip-flops in the core scan chain are designed for core peripheral testing of full residual test modes using sequential scan techniques.

6. The SoC as in claim 2, wherein the core internal test modes are based on testing the core internal flip-flops that are internal to the plurality of cores and that do not interact with the interface (periphery) of the plurality of cores.

7. The SoC as in claim 2, wherein the reduced core scan segment model is used for implementing the partial residual test modes, the partial residual test modes based on pure combinational interactions among test modes.

8. The SoC as in claim 2, wherein the full residual test modes include testing for faults in the glue logic.

9. The SoC as in claim 2, wherein the partial residual test modes are based on a minimum number of flip-flops that interact with the glue logic.

10. The SoC as in claim 1, wherein the core scan segments based on resting only those scan flip-flops tested during partial residual test modes provide the reduced core scan segment model.

11. The SoC as in claim 1, wherein the reduced core scan segment model works with on-chip test compression solutions such that a significant reduction of residual test cycles arc obtained.

12. The SoC as in claim 3, wherein the decompressor comprises a LFSR or a ring generator.

13. The SoC as in claim 3, wherein the compactor is selected from the group consisting of MISR, XOR TREE, and AND TREE.

14. A method of testing a SoC having a plurality of cores, wherein the plurality of cores arc in communicating relationship with each other via a glue logic, and each of the plurality of cores including, a corresponding plurality of flip-flops, wherein said plurality of flip-flops include core internal flip-flops and core peripheral flip-flops, the method comprising:
determining core scan segments that substantially include the scan flip-flops that require testing each partial residual test mode interaction in the SoC;
reconfiguring the core scan segments to form a reduced core scan segment model for on-chip test compression; and
resting interactions between the plurality of cores via the glue logic using the reduced core scan segment model.

15. The method of claim 14, wherein determining the core scan segments that substantially include the scan flip-flops that require testing each partial residual test mode, comprises:
quantifying interactions between the plurality of cores;
identifying test groups and test modes based on quantified interaction between the plurality of cores;
extracting a minimal set of flip-flops for the test groups and the test modes; and
determining core scan segments based on the test groups and the test modes.

16. The method of claim 15, wherein quantifying the interactions between the plurality of cores comprises:
performing core internal testing of each of the plurality of cores using sequential scan techniques to test core internal flip-flops; and performing core peripheral testing of each of the plurality of cores using sequential scan techniques to test core peripheral flip-flops to quantify the interactions between the plurality of cores.

17. The method of claim 15, wherein identifying the test groups comprises:
identifying the test groups using test modes selected from the group consisting of core internal test modes, full residual test modes, and partial residual test modes.

18. The method of claim 17, wherein reconfiguring the core scan segments comprises:
reconfiguring the core scan segments to a reduced core scan segment model for on-chip test compression.

19. The method as in claim 17, wherein the core internal test modes are based on testing the flip-flops that are internal to the plurality of cores and that do not interact with the periphery of the core.

20. The method as in claim 17, wherein the partial residual test modes are based on pure combinational interactions among the test modes.

21. The method as in claim 17, wherein the full residual test modes include testing for faults in the glue logic.

22. The method as in claim 17, wherein the partial residual test modes are based on a minimum number of flip-flops that interact with the glue logic.

23. A computer readable storage medium carrying one or more sequences of instructions to facilitate Design-for-Test (DFT) of a SoC, the SoC including a plurality of cores in communicating relationship with each other via a glue logic, each of the plurality of cores including a corresponding plurality of flip-flops, wherein said plurality of flip-flops include core internal flip-flops and core peripheral flip-flops, wherein execution of the one or more sequences of instructions by one or more processors contained in the SoC causes one or more processors to perform the steps of:
determining core scan segments that substantially include scan flip-flops that require testing each partial residual test mode interaction in the SoC;
reconfiguring the core scan segments to form a reduced core scan segment model for on-chip test compression; and
testing interactions between the plurality of cores via the glue logic using the reduced core scan segment model.

24. The computer readable storage medium of claim 23, wherein determining the core scan segments that substantially include the scan flip-flops that require testing each partial residual test mode, comprises:
quantifying interactions between the plurality of cores;
identifying test groups and test modes based on quantified interaction between the plurality of cores;
extracting a minimal set of flip-flops for the test groups and the test modes; and
determining core scan segments based on the test groups and the test modes.

25. The computer readable storage medium of claim 24, wherein quantifying the interactions between the plurality of cores comprises:
performing core internal testing of each of the plurality of cores using sequential scan techniques to test core internal flip-flops; and
performing core peripheral testing of each of the plurality of cores using sequential scan techniques tot test: core peripheral flip-flops to quantify the interactions.

* * * * *